United States Patent
Miao et al.

(10) Patent No.: US 8,331,131 B2
(45) Date of Patent: Dec. 11, 2012

(54) CHANGING A MEMRISTOR STATE

(75) Inventors: Feng Miao, Mountain View, CA (US); Jianhua Yang, Palo Alto, CA (US); Gilberto Medeiros Ribeiro, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 173 days.

(21) Appl. No.: 13/018,040

(22) Filed: Jan. 31, 2011

(65) Prior Publication Data

US 2012/0195099 A1    Aug. 2, 2012

(51) Int. Cl.
G11C 11/00 (2006.01)
H01L 47/00 (2006.01)
H01L 21/20 (2006.01)

(52) U.S. Cl. .............. 365/148; 257/1; 257/4; 257/5; 257/E45.001; 257/E45.002; 438/382

(58) Field of Classification Search .......... 365/148; 257/1, 4, 8, E45.001, E45.002; 438/382
See application file for complete search history.

(56) References Cited

U.S. PATENT DOCUMENTS

| | | | |
|---|---|---|---|
| 6,987,689 B2 | 1/2006 | Bozano et al. | |
| 7,646,630 B2 | 1/2010 | Lowrey et al. | |
| 2004/0114419 A1 | 6/2004 | Lowrey et al. | |
| 2008/0079029 A1* | 4/2008 | Williams | 257/213 |
| 2008/0090337 A1* | 4/2008 | Williams | 438/133 |
| 2009/0026433 A1 | 1/2009 | Chiang | |
| 2009/0225583 A1 | 9/2009 | Lee et al. | |
| 2010/0080037 A1 | 4/2010 | Inoue et al. | |
| 2010/0110779 A1 | 5/2010 | Liu et al. | |
| 2010/0264397 A1* | 10/2010 | Xia et al. | 257/4 |
| 2011/0182107 A1* | 7/2011 | Wu et al. | 365/148 |
| 2011/0182108 A1* | 7/2011 | Williams et al. | 365/148 |
| 2011/0186801 A1* | 8/2011 | Yang et al. | 257/4 |
| 2011/0240941 A1* | 10/2011 | Pickett et al. | 257/1 |
| 2011/0266513 A1* | 11/2011 | Williams et al. | 257/4 |
| 2012/0127779 A1* | 5/2012 | Scheuerlein et al. | 365/148 |

* cited by examiner

Primary Examiner — Ly D Pham

(57) ABSTRACT

A method of changing a state of a memristor having a first intermediate layer, a second intermediate layer, and a third intermediate layer positioned between a first electrode and a second electrode includes applying a first pulse having a first bias voltage across the memristor, wherein the first pulse causes mobile species to flow in a first direction within the memristor and collect in the first intermediate layer thereby causing the memristor to enter into an intermediate state and applying a second pulse having a second bias voltage across the memristor, in which the second pulse causes the mobile species from the first intermediate layer to flow in a second direction within the memristor and collect in the third intermediate layer, wherein the flow of the mobile species in the second direction causes the memristor to enter into a fully changed state.

15 Claims, 4 Drawing Sheets

US 8,331,131 B2

CHANGING A MEMRISTOR STATE

BACKGROUND

Memristor switch devices, which are often formed of nanoscale metal/titanium oxide/metal layers, typically employ an "electroforming" process to enable resistive switching. The "electroforming" process involves a one-time application of a relatively high voltage or current that produces a significant permanent change of electric conductivity through the titanium oxide layer. The electrical switching arises from the coupled motion of electrons and ions within the oxide material. During the electroforming process, oxygen vacancies are created and drift towards the cathode, forming localized conducting channels of sub-oxides in the oxide.

The localized conducting channels are formed to include a small gap between the ends of the conducting channels and a metal layer. The gap typically forms about a 2 nm-wide tunnel barrier at the tops of the conducting channels. As voltage is applied, oxygen vacancies are driven out of the conduction channel into the barrier region, which changes the resistance of the memristor switch device. The diffusion constant for the oxygen vacancies is practically zero at room temperature. As such, in the absence of an applied bias voltage, the oxygen vacancies will remain in the barrier region and the memristor switch device will retain its state at room temperature.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
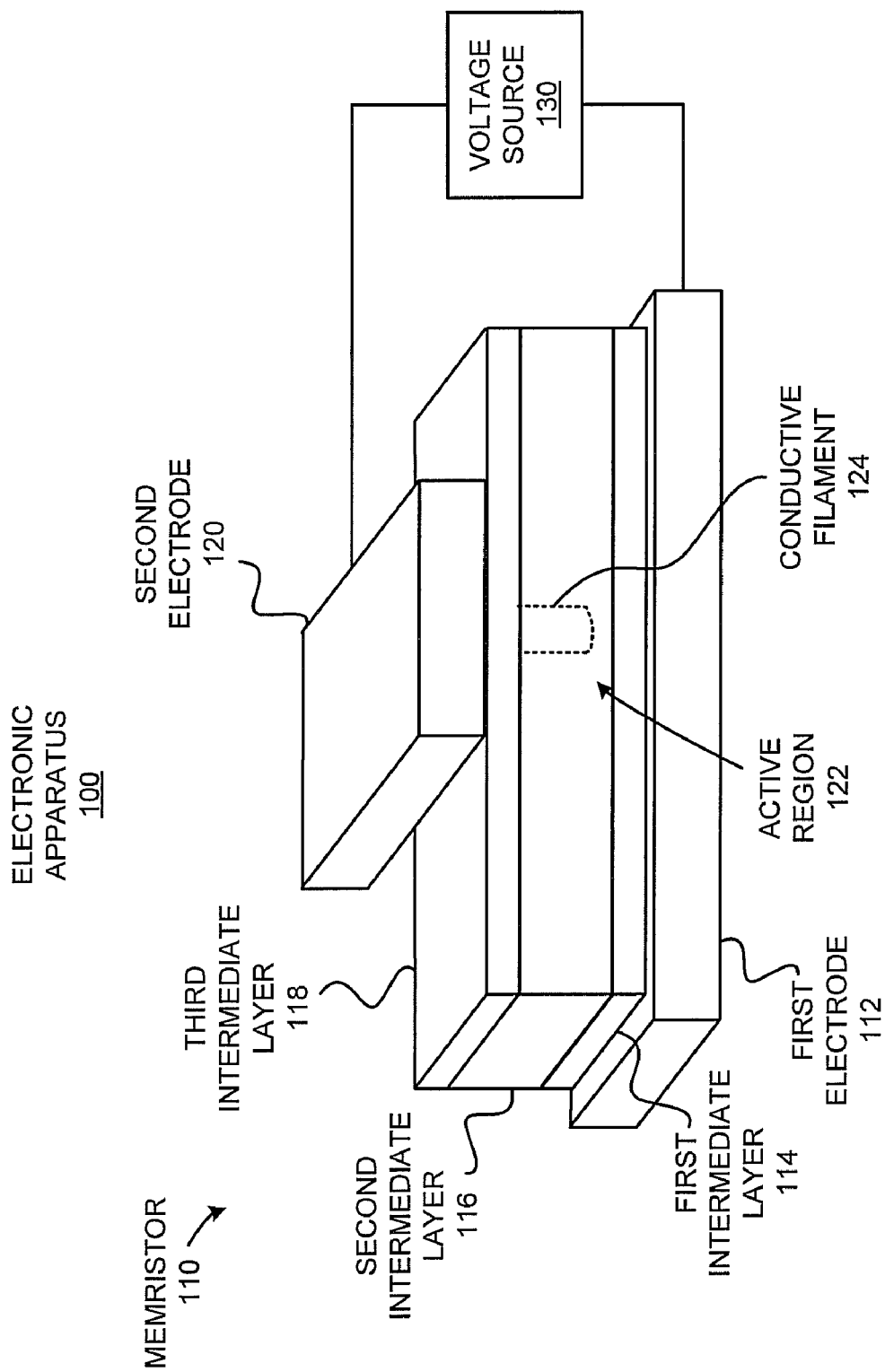
FIG. 1 shows a perspective view of a portion of an electronic apparatus, according to an example of the present disclosure.

For simplicity and illustrative purposes, the present disclosure is described by referring mainly to examples thereof. In the following description, numerous specific details are set forth in order to provide a thorough understanding of the present disclosure. It will be readily apparent however, that the present disclosure may be practiced without limitation to these specific details. In other instances, some methods and structures are not described in detail so as not to unnecessarily obscure the description of the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Disclosed herein is a method of changing a state of a memristor having a first intermediate layer, a second intermediate layer, and a third intermediate layer positioned between a first electrode and a second electrode. In the method, a first pulse having a first bias voltage is applied across the memristor to cause mobile species to collect in the first intermediate layer. In addition, a second pulse having a second bias voltage is applied across the memristor to cause mobile species from the first intermediate layer to flow to and collect in the third intermediate layer. The bias voltages refer to one of a negative and a positive voltage.

Through implementation of the method disclosed herein, a tunnel barrier is maintained in the first intermediate layer of the memristor for both the on and off states of the memristor. In this regard, the resistance through the memristor is generally higher for both the on and off states as compared with conventional memristors having a single tunnel barrier for one state and substantially no tunnel barrier for the other state. As such, the memristor disclosed herein may be operated with lower power consumption and a relatively larger on-off ratio as compared with conventional memristors.

The term "singly configurable" means that a switch is able to change its state only once via an irreversible process such as an electrochemical oxidation or reduction reaction; such a switch may be the basis of a programmable read only memory (PROM), for example. The term "reconfigurable" means that a switch can change its state multiple times via a reversible process such as an electrochemical oxidation or reduction; in other words, the switch may be opened and closed multiple times such as the memory bits in a random access memory (RAM). The term "configurable" means either "singly configurable" or "reconfigurable".

Micron-scale dimensions refer to dimensions that range from 1 micrometer to a few micrometers in size. Sub-micron scale dimensions refer to dimensions that range from 0.1 nanometers to 1 micrometers. Micron-scale and submicron-scale wires refer to rod or ribbon-shaped conductors or semiconductors with widths or diameters having the dimensions of 0.005 to 10 micrometers, heights that can range from a few nanometers to a micrometer, and length's of several micrometers and longer. For the purposes of this application, nanometer scale dimensions refer to dimensions ranging from 1 to 50 nanometers.

A memristor is a two-terminal device in which the magnetic flux between the terminals is a function of the amount of electric charge that has passed through the device.

The memristor discussed herein may be implemented in a cross-bar array formed of a plurality of the memristors. In one respect, conductance channels in the plurality of memristors may be formed in each of the memristors and the memristors may be individually addressed. A crossbar is an array of switches that can connect each wire in one set of parallel wires to every member of a second set of parallel wires that intersects the first set (usually the two sets of wires are perpendicular to each other, but this is not a necessary condition).

With reference first to FIG. 1, there is shown a perspective view of a portion of an electronic apparatus 100, according to an example. It should be understood that the electronic apparatus 100 depicted in FIG. 1 may include additional components and that some of the components described herein may be removed and/or modified without departing from a scope of the electronic apparatus 100. It should also be understood that the components depicted in FIG. 1 are not drawn to scale and thus, the components may have different relative sizes with respect to each other than as shown therein.

As depicted in FIG. 1, the electronic apparatus 100 includes a memristor 110 and a voltage source 130. The memristor 110 is depicted as including a first electrode 112, a first intermediate layer 114, a second intermediate layer 116, a third intermediate layer 118, and a second electrode 120. In addition, the first electrode 112 is depicted as being in a relatively crossed arrangement with respect to the second electrode 120. The area in the intermediate layers 114-118 where the first electrode 112 crosses the second electrode 120 is construed as an active region 122 because this is the region in which the electrical behavior of the intermediate layers 114-118 is varied as discussed in greater detail herein below.

The active region 122 of the second intermediate layer 116 is also depicted as including a conductive filament 124 extending substantially between a bottom surface and a top surface of the second intermediate layer 116. The conductive filament 124 may be formed in the second intermediate layer 106 through implementation of any suitable process. For instance, the conductive filament 124 may be formed through an electroforming process, in which a relatively large forming voltage is applied across the first electrode 112 and the second electrode 120. In addition or alternatively, the conductive filament 124 may be formed through exposure of the second intermediate layer 116 to a relatively high temperature environment for a period of time. In any regard, the first and third intermediate layers 112 and 118 form tunnel barriers in one state of the memristor 110, as discussed in greater detail herein below.

The first electrode 112 and the second electrode 120 may be formed of any suitable conductive material, such as, platinum (Pt), gold (Au), cobalt (Co), osmium (Os), palladium (Pd), nickel (Ni), silver (Ag), aluminum (Al), barium (Ba), europium (Eu), gadolinium (Gd), lanthanum (La), magnesium (Mg), neodymium (Nd), scandium (Sc), vanadium (V), yttrium (Y), etc. The first and second electrodes 112 and 120 may also be formed of metallic compound contacts, such as, TiNx, HfCx, and the like. In addition, although the first electrode 112 and the second electrode 120 have been shown with rectangular cross-sections, the first electrode 112 and/or the second electrode 120 may have circular, hexagonal, or more complex cross-sections, such as, triangular cross-sections. The first and second electrodes 112, 120 may also have many different widths or diameters and aspect ratios or eccentricities.

The intermediate layers 114-118 are composed of materials that are switched between a generally insulating (OFF) state and a generally conductive (ON) state by migration of mobile species. The migration of mobile species in the intermediate layers 114-118 may occur, for instance, through the bias of a voltage applied through the switching layer 106 across the first electrode 112 and the second electrode 120. In this regard, the intermediate layers 114-118 are composed of switching materials, such as a material formed of a molecule having a switchable segment or moiety that is relatively energetically stable in two different states. The intermediate layers 114-118 may include materials that include any suitable material known to exhibit these properties. By way of particular example, the intermediate layers 114-118 are composed of titanium dioxide ($TiO_2$) or other oxide species, such as W oxides, Ta oxide, Nb oxides, Zr oxide, Hf oxide, Si oxide, Y oxide, V oxide, Cr oxides, Mo oxides, Mn oxides, Fe oxides, Co oxide, Al oxide, Sm oxide, Er oxide, Gd oxide, Ga oxide, nickel oxide or zinc oxide, etc. Other non-oxide insulating, semiconducting materials may also be used as the intermediate layer, such as nitrides, carbides, etc. By way of another particular example, the first and third intermediate layers 114 and 118 are formed of titanium dioxide ($TiO_2$) and the second intermediate layer 116 is formed of titanium oxide ($Ti_4O_7$).

The voltage source 130 is depicted as being electrically connected to the first electrode 112 and the second electrode 120. The voltage source 130 is therefore able to cause electrical current to flow between the first electrode 112 and the second electrode 120 and therefore through the intermediate layers 114-118. In addition, the voltage source 130 is controlled to selectively apply a positive voltage or a negative voltage across the memristor 110 to place the memristor 110 into one of an "on" state and an "off" state as discussed in detail below. Although not shown, the electronic apparatus 100 may include a reader to determine the resistance through the memristor 110 for a particular applied voltage.

It should be understood that the memristor 110 has been depicted in a simplified manner in FIG. 1 and that the memristor 110 may therefore be modified from the version depicted therein without departing from a scope of the electronic apparatus 100. For instance, the electronic apparatus 100 may include a plurality of memristors 110 arranged in a cross-bar array (not shown), to thereby include a number of individually addressable units. In addition or alternatively, the intermediate layers 114-116 may be formed of sheets of material that extend beyond individual memristors 110.

The memristor 110 may be built at the micro- or nano-scale and used as a component in a wide variety of electronic circuits, such as, bases for memories and logic circuits. When used as a basis for memories, the memristor 110 may be used to store a bit of information, 1 or 0. When used as a logic circuit, the memristor 110 may be employed to represent bits in a Field Programmable Gate Array, or as the basis for a wired-logic Programmable Logic Array. The memristor 110 disclosed herein is also configured to find uses in a wide variety of other applications.

The memristor 110 may be fabricated through any reasonably suitable fabrication process, such as, for instance, chemical vapor deposition, sputtering, etching, lithography, etc., of the components forming the memristor 110. In addition, the intermediate layers 112-118 may be grown between the first electrode 112 and the second electrode 120.

Figure 2:
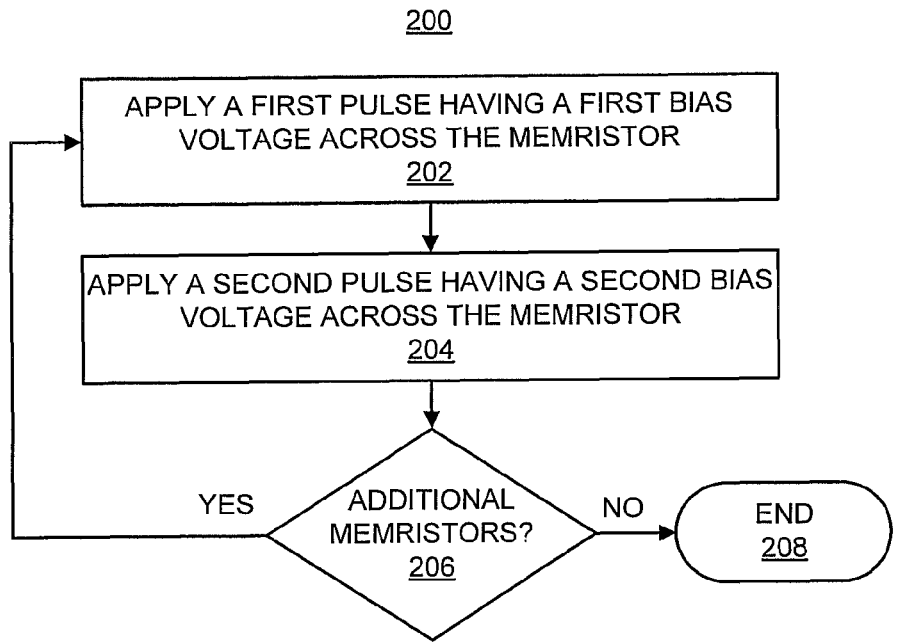
FIG. 2 shows a flow diagram of a method of changing a state of a memristor, according to an example of the present disclosure.

Turning now to FIG. 2, there is shown a flow diagram of a method 200 of changing a state of a memristor 110, according to an example of the present disclosure. It should be understood that the method 200 depicted in FIG. 2 may include additional features and that some of the features described herein may be removed and/or modified without departing from a scope of the method 200.

At block 202, a first pulse having a first bias voltage is applied across the memristor 110. More particularly, the voltage source 130 is operated to apply the first pulse through the second electrode 120 and the first electrode 112. The first bias voltage may comprise a positive voltage and may be applied for a predetermined length of time based upon, for instance, the material system and voltage magnitude. By way of particular example, the first pulse duration is between about 1 μs to 1 ns.

At block 204, a second pulse having a second bias voltage with opposite polarity is applied across the memristor 110. More particularly, the voltage source 130 is operated to apply the first pulse through the second electrode 120 and the first electrode 112. The second bias voltage may comprise a negative voltage and may be applied for a predetermined length of time as discussed above with respect to the first pulse at block 202.

At block 206, a determination as to whether the state of an additional memristor 110 is to be modified is made. If the state of an additional memristor 110 is to be modified, blocks 202 and 204 are applied to the additional memristor 110. In addition, blocks 202-206 may be repeated for each of the memristors 110 that are to be modified. If no additional memristors 110 are to be modified at block 206, the method 200 may end as indicated at block 208.

The electronic apparatus 100 may thus be equipped with mechanisms (not shown) to address individual ones of the memristors 110, for instance, when the memristors 110 are formed in a two-dimensional array. Thus, for instance, a plurality of first electrodes 112 may be arranged in a crossed arrangement with a plurality of second electrodes 120 and each of the memristors 110 may be individually addressed through selective addressing of a particular first electrode 112 and a particular second electrode 120.

Figure 3:
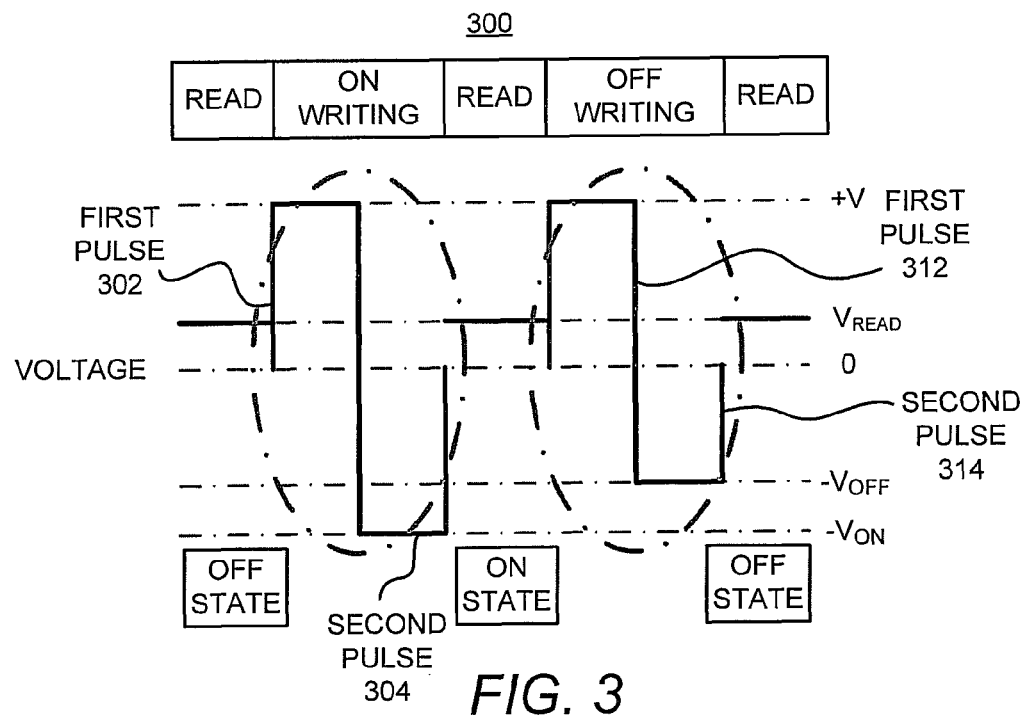
FIG. 3 shows a diagram that graphically depicts the application of the first pulse and the second pulse of voltages across a memristor for a transition from the off state to the on state and from the on state to the off state, according to an example of the present disclosure.

Turning now to FIG. 3, there is shown a diagram 300 that graphically depicts the application of the first pulse and the second pulse of voltages across the memristor 110 at blocks 202 and 204 for a transition from the off state to the on state and from the on state to the off state, according to an example of the present disclosure. The diagram 300 also shows a voltage level for reading the state of the memristor 110, which is identified by ($V_{READ}$).

As shown therein, for a transition from the off state to the on state (ON-WRITING), the first pulse 302 has a positive voltage and has a magnitude identified by (+V). In addition, the second pulse 304 has a negative voltage and has a magnitude identified by ($-V_{ON}$).

For a transition from the on state to the off state (OFF-WRITING), the first pulse 312 also has a positive voltage and has a magnitude identified by (+V). In addition, the second pulse 314 has a negative voltage and has a magnitude identified by ($-V_{OFF}$), which is depicted as being relatively smaller than the magnitude of the negative voltage ($-V_{ON}$) of the second pulse 304 in the transition from the off state to the on state. Therefore, as shown in FIG. 3, for both On and OFF switching, a positive voltage pulse with a magnitude of +V is used to first set the device into the intermediate state. Then a negative voltage pulse is used to switch the device, either in the ON or OFF state depending on the magnitude of the negative voltage. Note that in this specific example, the voltage is applied on the top electrode and bottom electrode is grounded. The switching polarity of the memristor, however, may be opposite to the above example, depending on the layer stack, fabrication process and electrical operation history of the memristor.

Figure 4:
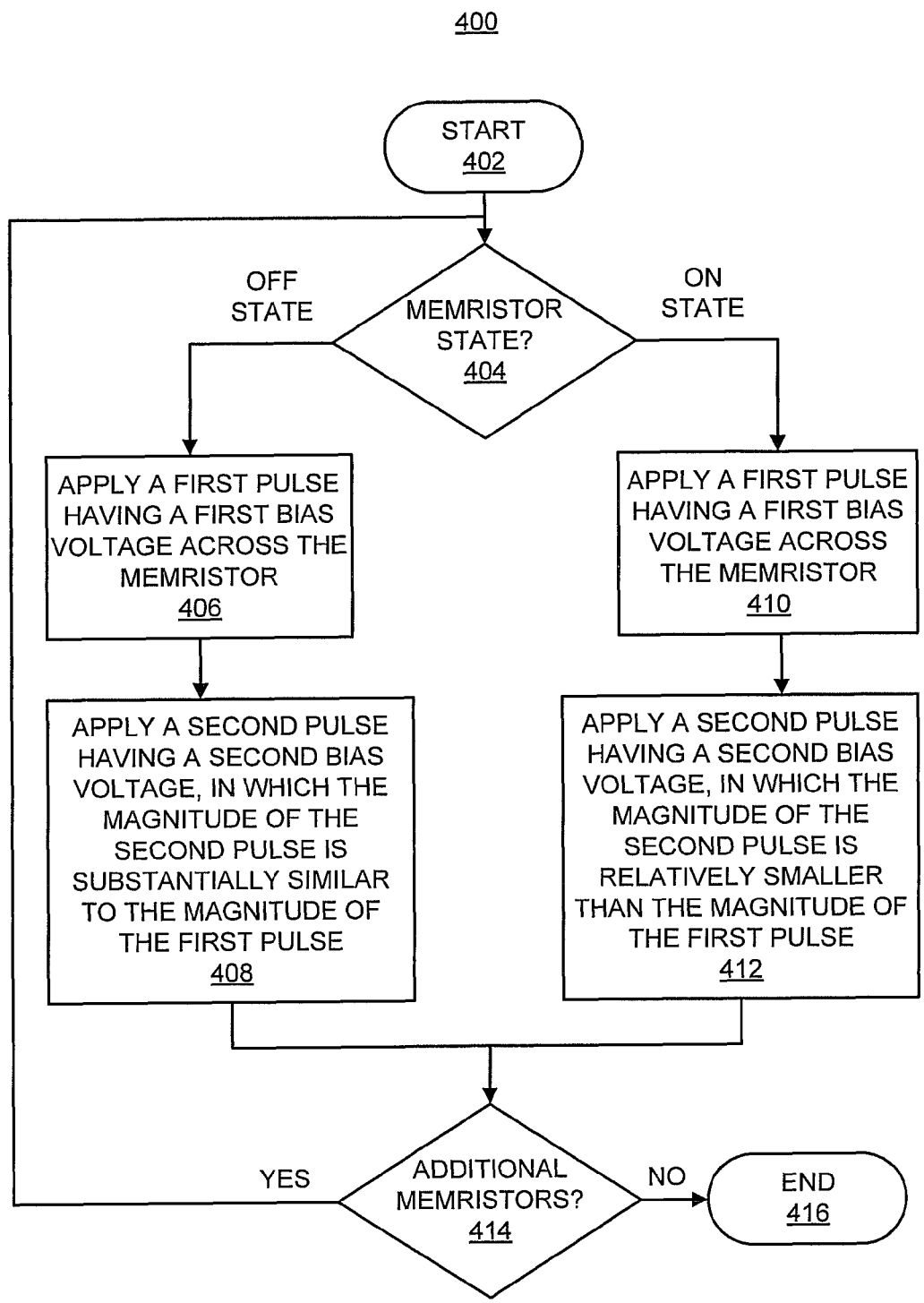
FIG. 4 shows a flow diagram of a method of changing a state of a memristor, according to another example of the present disclosure.

With reference now to FIG. 4, there is a flow diagram of a method 400 of changing a state of a memristor 110, according to another example of the present disclosure. It should be understood that the method 400 depicted in FIG. 4 may include additional features and that some of the features described herein may be removed and/or modified without departing from a scope of the method 400. Generally speaking, the method 400 comprises similar, but relatively more detailed, features as compared with the method 200 depicted in FIG. 2. In addition, the description of the method 400 is made with respect to the diagram 500 in FIG. 5, which depicts the memristor 110 at various stages during the transitions between the on and off states, according to an example.

At block 402, the method 400 is initiated in response to any suitable instruction or as part of an automated electronic apparatus 100 operation routine. In one regard, the method 400 may be implemented to change the state of the memristor 110 from an off state to an on state or from an on state to an off state.

At block 404, a determination as to whether the memristor 110 is in an on state or an off state is made. This determination may be made by applying the reading voltage ($V_{READ}$) across the memristor 110 and determining the current flow through the memristor 110. For instance under the reading voltage $V_{READ}$, a relatively larger current through the memristor 110 may be indicative of the on state and a relatively smaller current through the memristor 110 may be indicative of the off state. As discussed below, the differences in current flow may occur due to differences in resistance levels through the memristor 110.

Figure 5:
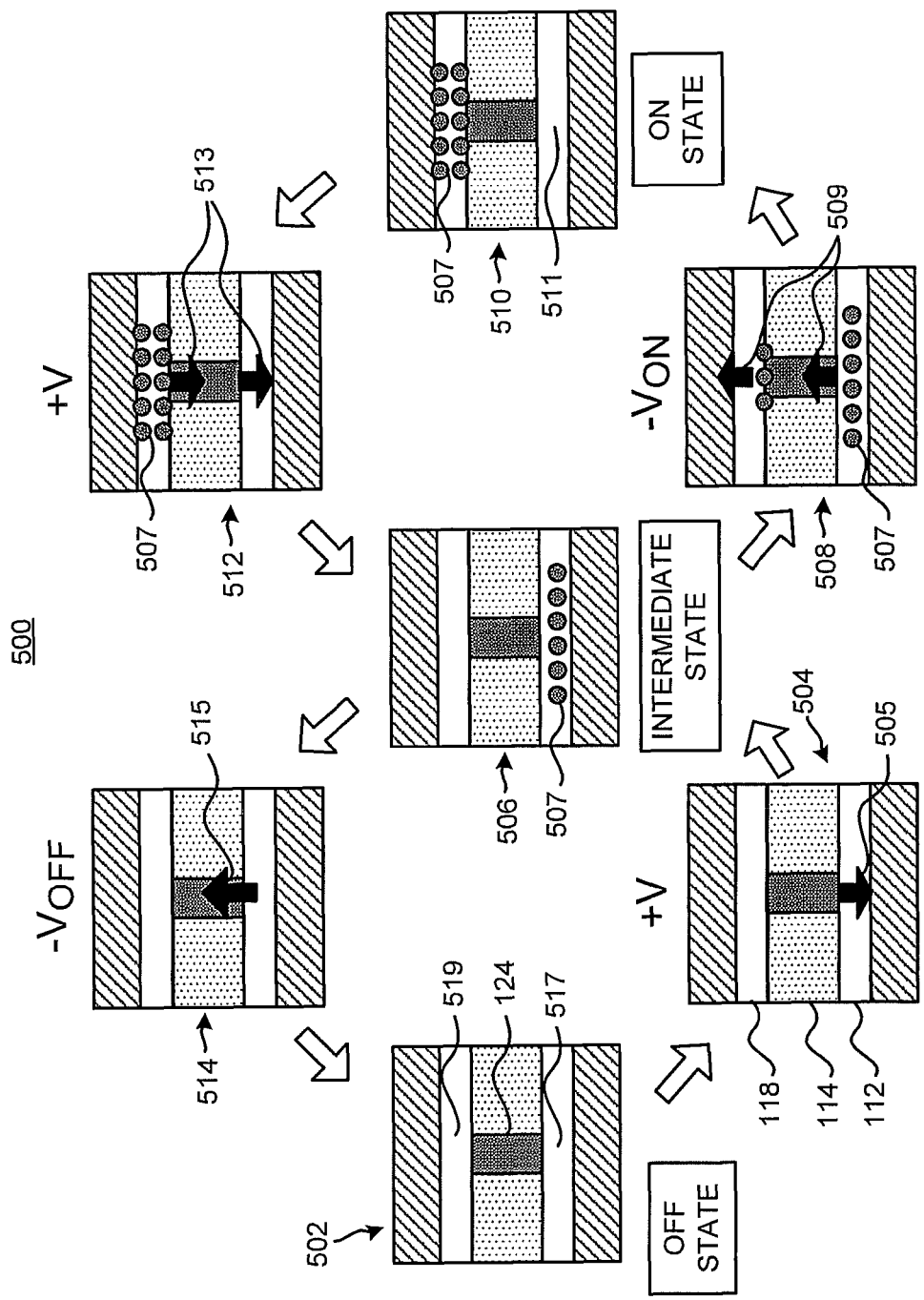
FIG. 5 illustrates a diagram of the memristor of FIG. 1 at various stages during transitions between the on and off states, according to an example of the present disclosure.

In response to a determination that the memristor 110 is in the off state, a first pulse having a first bias voltage is applied across the memristor 110 as indicated at block 406. The first pulse may comprise a positive voltage and may be applied as discussed above with respect to block 202 in FIG. 2 and element 302 in FIG. 3. With reference to FIG. 5, the memristor 110 may originally have the state 502 prior to block 406 and the state 504 following application of the first pulse 302 at block 406. At state 504, mobile species are depicted as flowing toward the first intermediate layer 114 from the third intermediate layer 118 through the conductive filament 124 in the second intermediate layer 116, as indicated by the arrow 505. The mobile species serve as dopants and therefore change the resistance of the film stack.

The memristor 110 may enter an intermediate state 506 following application of the first pulse 302. At the intermediate state 506, the mobile species 507 are depicted as having been collected in the first intermediate layer 112, which causes the first intermediate layer 112 to become relatively more conductive.

With reference back to FIG. 4, at block 408, a second pulse 304 having a second bias voltage with opposite polarity than the first pulse 302 is applied across the memristor 110. The second pulse 304 may comprise a negative voltage and may be applied as discussed above with respect to block 204 in FIG. 2 and element 304 in FIG. 3. As shown in FIG. 5, application of the second pulse 304 causes the mobile species 507 to flow toward the third intermediate layer 118 as indicated by the arrows 509 and depicted in state 508. More particularly, as depicted in state 508, the mobile species 507 that were collected at the intermediate state 506 in the first intermediate layer 512 flow through the conductive filament 124 to the third intermediate layer 518.

The memristor 110 may enter the on state 510 following application of the second pulse 304. At the on state 510, the mobile species 507 are depicted as having been collected in the third intermediate layer 118. In addition, a tunnel barrier 511 is depicted as being formed in the first intermediate layer 112. In other words, while the third intermediate layer 118 has become relatively more conductive through the collection of mobile species 507, the first intermediate layer 112 provides a tunnel barrier due to the removal of the mobile species 507. In this regard, the resistance of the memristor 110 is relatively higher than conventional memristors in the on state. As such, the memristor 110 disclosed herein is characterized as having a lower operation power and relatively reliable operations as compared with conventional memristors.

With reference back to FIG. 4, in response to a determination that the memristor 110 is in the on state, a first pulse having a first bias voltage is applied across the memristor 110 as indicated at block 410. The first pulse may comprise a positive voltage and may be applied as discussed above with respect to block 202 in FIG. 2 and element 312 in FIG. 3. With reference to FIG. 5, the memristor 110 may originally have the state 510 prior to block 410 and the state 512 following application of the first pulse 312 at block 410. At state 512, the mobile species 507 are depicted as flowing toward the first intermediate layer 114 from the third intermediate layer 118 through the conductive filament 124 in the second intermediate layer 116, as indicated by the arrows 513.

The memristor 110 may enter the intermediate state 506 following application of the first pulse 312. At the intermediate state 506, the mobile species 507 are depicted as having been depleted in the third intermediate layer 118 and collected in the first intermediate layer 112, which causes the first intermediate layer 112 to become relatively more resistive in comparison to the on state 510.

With reference back to FIG. 4, at block 412, a second pulse 314 having a second bias voltage, in which the magnitude of the second pulse is relatively smaller than the magnitude of the second pulse 304 is applied across the memristor 110. The relatively smaller magnitude of the second pulse 314 as compared with the magnitude of the second pulse 304 generally prevents mobile species 507 from collecting in the third intermediate layer 118 and therefore substantially prevents the third intermediate layer 118 from becoming more conductive. The second pulse 314 may be applied as discussed above with respect to block 204 in FIG. 2 and element 314 in FIG. 3. As shown in FIG. 5, application of the second pulse 314 causes the mobile species 507 to flow toward the third intermediate layer 118 as indicated by the arrow 515 and depicted in state 514. More particularly, as depicted in state 514, the mobile species 507 that were collected at the intermediate state 506 in the first intermediate layer 512 flow back through the conductive filament 124 to the third intermediate layer 518.

The memristor 110 may enter the off state 502 following application of the second pulse 314. At the on state 502, the mobile species 507 may substantially return to normal levels in the first and third intermediate layers 112 and 118, thereby causing the first and third intermediate layers 112 and 118 to form tunnel barriers 517 and 519 in the memristor 110. The tunnel barriers 517 and 519 generally increase the resistivity of the intermediate layers 112-118 as compared with conventional memristors.

At block 414, a determination as to whether the state of an additional memristor 110 is to be modified is made. If the state of an additional memristor 110 is to be modified, blocks 404-412 may be repeated on the additional memristor 110 depending upon the state of the memristor determined at block 404. In addition, blocks 404-412 may be repeated for each of the memristors 110 that are to be modified. If no additional memristors 110 are determined to be modified at block 414, the method 400 may end as indicated at block 416. The electronic apparatus 100 may also be equipped with mechanisms to enable individual ones of the memristors 110 to be addressed as discussed above with respect to FIG. 2.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method of changing a state of a memristor having a first intermediate layer, a second intermediate layer, and a third intermediate layer positioned between a first electrode and a second electrode, said method comprising:
   applying a first pulse having a first bias voltage across the memristor, wherein the first pulse causes mobile species to flow in a first direction within the memristor and collect in the first intermediate layer thereby causing the memristor to enter into an intermediate state; and
   applying a second pulse having a second bias voltage across the memristor, wherein the second pulse causes the mobile species from the first intermediate layer to flow in a second direction within the memristor and collect in the third intermediate layer, wherein the flow of the mobile species in the second direction causes the memristor to change from the intermediate state to a fully changed state.

2. The method according to claim 1, further comprising:
   determining whether the memristor is in an off state or an on state.

3. The method according to claim 2, further comprising:
   applying the first pulse across the memristor prior to applying the second pulse in response to the state of the memristor being changed from the off state to the on state and from the on state to the off state.

4. The method according to claim 2, wherein applying the first pulse across the memristor further comprises applying a substantially similar level of first bias voltage across the memristor for changes from the off state to the on state and the on state to the off state.

5. The method according to claim 2, wherein applying the second pulse across the memristor further comprises:
   applying a pulse having a first level of second bias voltage across the memristor for a change from the off state to the on state; and
   applying a pulse having second level of second bias voltage across the memristor for a change from the on state to the off state, wherein the second level of second bias voltage differs from the first level of second bias voltage.

6. The method according to claim 2, wherein applying the first pulse and applying the second pulse further comprises applying first and second pulses having substantially similar voltage levels for a change from the off state to the on state.

7. The method according to claim 2, wherein applying the first pulse and applying the second pulse further comprises applying first and second pulses having substantially different voltage levels for a change from the on state to the off state.

8. The method according to claim 1, wherein the second intermediate layer is positioned between the first intermediate layer and the third intermediate layer, and wherein a conductive filament is formed in the second intermediate layer between the first and third intermediate layers.

9. The method according to claim 8, further comprising:
   maintaining a tunnel barrier in the first intermediate layer for both the on state and the off state through application of the first pulse and the second pulse across the memristor.

10. A method of changing on and off states of a memristor composed of a first electrode, a first intermediate layer positioned on the first electrode, a second intermediate layer positioned on the first intermediate layer, a third intermediate layer positioned on the second intermediate layer, and a second electrode positioned on the third intermediate layer, wherein a conductive filament is formed in the second intermediate layer between the first and third intermediate layers, said method comprising:
   applying a first pulse having a first bias voltage between the first electrode and the second electrode to cause mobile species to flow in a first direction within the memristor and collect in the first intermediate layer thereby causing the memristor to enter into an intermediate state; and
   applying a second pulse having a second bias voltage between the first electrode and the second electrode to cause the mobile species to flow in a second direction within the memristor from the first intermediate layer to the third intermediate layer substantially through the conductive filament formed in the second intermediate layer, wherein the flow of the mobile species in the second direction causes the memristor to change from the intermediate state to a fully changed state, wherein the successive application of the first pulse and is the second pulse results in a tunnel barrier being maintained in the first intermediate layer in both the on state and the off state.

11. The method according to claim 10, further comprising: applying the first pulse prior to applying the second pulse in response to the memristor being changed from the off state to the on state and from the on state to the off state.

12. The method according to claim 10, wherein applying the first pulse further comprises applying a substantially similar level of first bias voltage for changes from the off state to the on state and the on state to the off state.

13. The method according to claim 10, wherein applying the second pulse further comprises:
applying the second pulse to have a first level of second bias voltage for a change from the off state to the on state; and
applying the second pulse to have a second level of second bias voltage for a change from the on state to the off state, wherein the second level of second bias voltage differs from the first level of second bias voltage.

14. An electronic apparatus comprising:
a memristor formed of,
a first electrode;
a first intermediate layer positioned on the first electrode;
a second intermediate layer positioned on the first intermediate layer;
a third intermediate layer positioned on the second intermediate layer;
a second electrode positioned on the third intermediate layer;
a conductive filament formed in the second intermediate layer is between the first and third intermediate layers; and
a voltage source connected to the first electrode and the second electrode, wherein the voltage source is to change a state of the memristor between an on state and an off state through application of a first pulse having a first bias voltage across the memristor thereby causing the memristor to enter into an intermediate state and a second pulse having a second bias voltage, wherein application of the first pulse and the second pulse causes a tunnel barrier to be maintained in the first intermediate layer for both the on state and the off state, and the second pulse causes the memristor to change from the intermediate state to a fully changed state.

15. The electronic apparatus according to claim 14, wherein the voltage source is further to apply the second pulse at different voltage levels for a change from the on state to the off state and for a change from the off state to the on state.

* * * * *

UNITED STATES PATENT AND TRADEMARK OFFICE
CERTIFICATE OF CORRECTION

PATENT NO. : 8,331,131 B2
APPLICATION NO. : 13/018040
DATED : December 11, 2012
INVENTOR(S) : Feng Miao et al.

Page 1 of 1

It is certified that error appears in the above-identified patent and that said Letters Patent is hereby corrected as shown below:

In column 9, line 3, in Claim 10, after "and" delete "is".

In column 10, line 8, in Claim 14, after "layer" delete "is".

Signed and Sealed this
Twelfth Day of March, 2013

Teresa Stanek Rea
*Acting Director of the United States Patent and Trademark Office*